United States Patent [19]

Lindeman

[11] Patent Number: 5,672,062

[45] Date of Patent: Sep. 30, 1997

[54] ELECTRICAL CONNECTORS

[75] Inventor: Richard Jay Lindeman, Rancho Viejo, Tex.

[73] Assignee: Labinal Components and Systems, Inc., Bensenville, Ill.

[21] Appl. No.: 241,663

[22] Filed: May 11, 1994

Related U.S. Application Data

[63] Continuation of Ser. No. 647,865, Jan. 30, 1991, abandoned.

[51] Int. Cl.⁶ .................................................. H01R 9/09
[52] U.S. Cl. .................................. 439/66; 439/91
[58] Field of Search ................... 439/65, 66, 91, 439/92, 101, 608

[56] References Cited

U.S. PATENT DOCUMENTS

| | | |
|---|---|---|
| Re. 27,089 | 3/1971 | Sear et al. . |
| 2,153,177 | 4/1939 | Ecker . |
| 2,853,656 | 9/1958 | Dowds . |
| 3,074,046 | 1/1963 | Sullivan . |
| 3,077,511 | 2/1963 | Bohrer et al. . |
| 3,200,297 | 8/1965 | Gibson . |
| 3,334,325 | 8/1967 | Conrad et al. . |
| 3,384,864 | 5/1968 | Schwartz . |
| 3,398,232 | 8/1968 | Hoffman . |
| 3,419,844 | 12/1968 | Schmued . |
| 3,509,296 | 4/1970 | Harshman et al. . |
| 3,513,434 | 5/1970 | Zielke . |

(List continued on next page.)

FOREIGN PATENT DOCUMENTS

| | | |
|---|---|---|
| 0072063A1 | 2/1983 | European Pat. Off. . |
| 73957 | 3/1983 | European Pat. Off. . |
| 0243021 | 10/1987 | European Pat. Off. . |
| 0 243 021 | 10/1987 | European Pat. Off. . |
| 0248521 | 12/1987 | European Pat. Off. . |
| 0314481 | 5/1989 | European Pat. Off. . |
| 2550894A1 | 2/1985 | France . |
| 2620267A1 | 5/1976 | Germany . |
| 2743406 | 5/1978 | Germany . |
| U8517334 | 6/1985 | Germany . |
| 6-165958 | 7/1987 | Japan . |
| 2098412 | 11/1982 | United Kingdom . |
| 2163305B | 2/1986 | United Kingdom . |
| 2 193 604 | 2/1988 | United Kingdom . |

OTHER PUBLICATIONS

High–Density Printed Circuit Connector, Callaway et al., IBM Tech. Discl. bull. vol. 8, No. 3, Aug. 1965, pp. 351–352.

Teradyne Technical bulletin 237, p. 8 with 339–17. LC and Jan. 29, 1985 noted on it.

"Shielded In–Line Electrical Multiconnector", Straus, IBM Technical Disclosure Bulletin, vol. 10, No. 3, Aug., 1967, p. 703.

EPO Search Report Mailed 01 Sep. 1995.

Application Ser. No. 07/738,051 filed Jul. 31, 1991 by or on behalf of Robert P. Stimson.

*Primary Examiner*—David L. Pirlot
*Assistant Examiner*—Daniel Wittels
*Attorney, Agent, or Firm*—Leydig, Voit & Mayer, Ltd.

[57] ABSTRACT

Connectors are provided for propagation of electrical signals in a plurality of closely spaced propagation paths, such as between circuits connected to conductive pads of circuit boards, each circuit presenting a certain characteristic impedance at a pad connected thereto. For example, each connector includes a plurality of resilient and electrically conductive signal-propagating interconnect means having opposite ends engageable with conductive pads on a pair of the circuit boards. The interconnect means are supported by insulating means of a support structure which also provides conductive ground means in adjacent relation to the conductive interconnect means. The conductive ground means are arranged for connection to grounding elements of the circuit boards. The configuration and characteristics of the ground conductor means and the insulating means in relation to each signal-propagating interconnect means are such as to obtain a certain characteristic impedance for matching the characteristic impedances of circuits interconnected by each signal-propagating interconnect means.

10 Claims, 5 Drawing Sheets

U.S. PATENT DOCUMENTS

| | | |
|---|---|---|
| 3,616,532 | 11/1971 | Beck . |
| 3,660,726 | 5/1972 | Ammond et al. . |
| 3,680,037 | 7/1972 | Nellis et al. . |
| 3,767,959 | 10/1973 | Toma et al. . |
| 3,795,037 | 3/1974 | Luttmer . |
| 3,795,047 | 3/1974 | Abolafia et al. . |
| 3,858,958 | 1/1975 | Davies . |
| 3,862,790 | 1/1975 | Davies et al. . |
| 3,871,728 | 3/1975 | Goodman . |
| 3,881,799 | 5/1975 | Elliott et al. . |
| 3,885,848 | 5/1975 | Brouneus . |
| 3,904,934 | 9/1975 | Martin . |
| 3,922,050 | 11/1975 | Lettini . |
| 3,932,932 | 1/1976 | Goodman . |
| 3,971,610 | 7/1976 | Buchoff et al. . |
| 3,992,652 | 11/1976 | Blaisdell . |
| 4,029,375 | 6/1977 | Gabrielian . |
| 4,064,623 | 12/1977 | Moore ........................ 29/629 |
| 4,068,910 | 1/1978 | Brown . |
| 4,082,399 | 4/1978 | Barkhuff . |
| 4,130,334 | 12/1978 | Anderson . |
| 4,130,934 | 12/1978 | Asick . |
| 4,133,592 | 1/1979 | Cobaugh et al. . |
| 4,179,170 | 12/1979 | Splitt . |
| 4,209,481 | 6/1980 | Kashiro et al. ............. 264/24 |
| 4,223,968 | 9/1980 | Kawabata . |
| 4,232,929 | 11/1980 | Zobawa . |
| 4,236,776 | 12/1980 | Wellington . |
| 4,243,283 | 1/1981 | McSparran . |
| 4,257,661 | 3/1981 | Dalamangas et al. . |
| 4,360,858 | 11/1982 | Fahling . |
| 4,386,814 | 6/1983 | Asick . |
| 4,389,080 | 6/1983 | Clark . |
| 4,394,712 | 7/1983 | Anthony . |
| 4,395,081 | 7/1983 | Melys . |
| 4,427,247 | 1/1984 | Petersen . |
| 4,451,099 | 5/1984 | Bricker . |
| 4,451,107 | 5/1984 | Dola . |
| 4,501,459 | 2/1985 | Chandler et al. . |
| 4,511,196 | 4/1985 | Shuler et al. . |
| 4,516,815 | 5/1985 | Venable . |
| 4,518,209 | 5/1985 | Negley . |
| 4,528,500 | 7/1985 | Lightbody et al. ........ 439/66 |
| 4,534,602 | 8/1985 | Bley . |
| 4,550,960 | 11/1985 | Asick . |
| 4,571,012 | 2/1986 | Bassler et al. . |
| 4,571,014 | 2/1986 | Robin et al. . |
| 4,571,015 | 2/1986 | Mueller . |
| 4,572,600 | 2/1986 | Nieman . |
| 4,574,331 | 3/1986 | Smolley . |
| 4,581,679 | 4/1986 | Smolley . |
| 4,582,374 | 4/1986 | Connor . |
| 4,582,385 | 4/1986 | Couper . |
| 4,593,961 | 6/1986 | Cosmos . |
| 4,620,761 | 11/1986 | Smith et al. . |
| 4,636,018 | 1/1987 | Stillie . |
| 4,645,278 | 2/1987 | Yevak, Jr. et al. . |
| 4,655,518 | 4/1987 | Johnson et al. . |
| 4,659,155 | 4/1987 | Walkup et al. . |
| 4,686,607 | 8/1987 | Johnson . |
| 4,688,864 | 8/1987 | Sorel . |
| 4,705,332 | 11/1987 | Sadigh-Benzadi . |
| 4,707,657 | 11/1987 | Boegh-Petersen ........ 324/158 |
| 4,710,133 | 12/1987 | Lindeman . |
| 4,720,770 | 1/1988 | Jameson .................... 361/387 |
| 4,733,172 | 3/1988 | Smolley . |
| 4,791,722 | 12/1988 | Miller, Jr. .................. 29/850 |
| 4,806,110 | 2/1989 | Lindeman . |
| 4,820,170 | 4/1989 | Redmond et al. .......... 439/66 |
| 4,820,376 | 4/1989 | Lambert et al. ........... 156/643 |
| 4,843,313 | 6/1989 | Walton ....................... 324/158 |
| 4,858,313 | 8/1989 | Bowlin ....................... 29/883 |
| 4,859,806 | 8/1989 | Smith . |
| 4,889,496 | 12/1989 | Neidich . |
| 4,902,857 | 2/1990 | Cranston et al. .......... 174/94 R |
| 4,961,709 | 10/1990 | Noschese .................... 439/66 |
| 4,988,306 | 1/1991 | Hopfer, III et al. ........ 439/66 |
| 4,992,053 | 2/1991 | Lindeman et al. .......... 439/66 |
| 5,004,427 | 4/1991 | Lindeman .................. 439/101 |
| 5,007,843 | 4/1991 | Smolley ..................... 439/66 |
| 5,013,249 | 5/1991 | Lindeman et al. . |
| 5,019,945 | 5/1991 | Smolley ..................... 361/412 |
| 5,037,332 | 8/1991 | Wilson . |
| 5,068,602 | 11/1991 | Meilke . |
| 5,089,880 | 2/1992 | Meyer et al. . |
| 5,121,299 | 6/1992 | Frankeny et al. . |
| 5,127,837 | 7/1992 | Shah et al. ................. 439/71 |
| 5,129,142 | 7/1992 | Bindra et al. . |
| 5,155,905 | 10/1992 | Miller, Jr. . |
| 5,167,512 | 12/1992 | Walkup . |

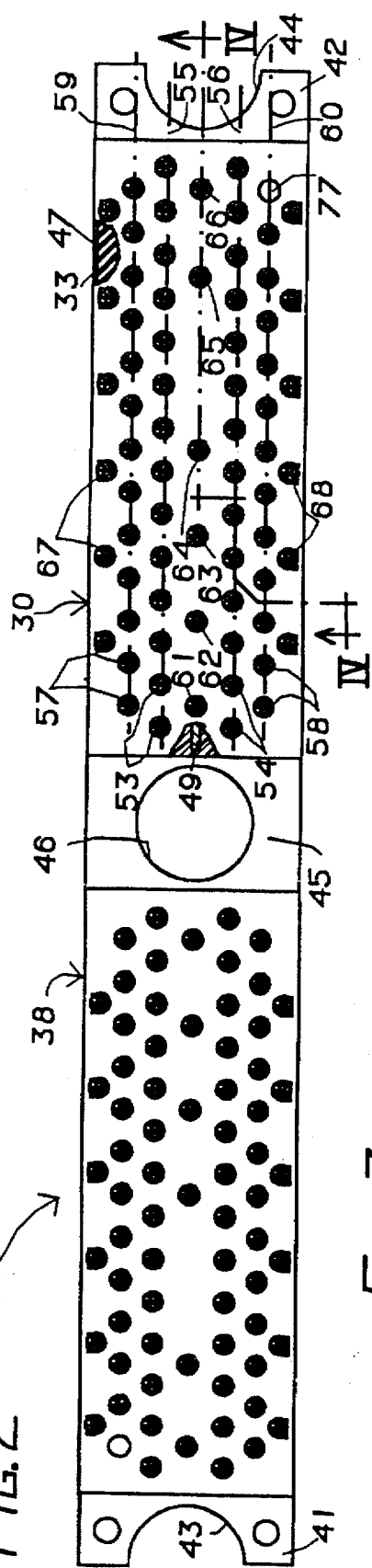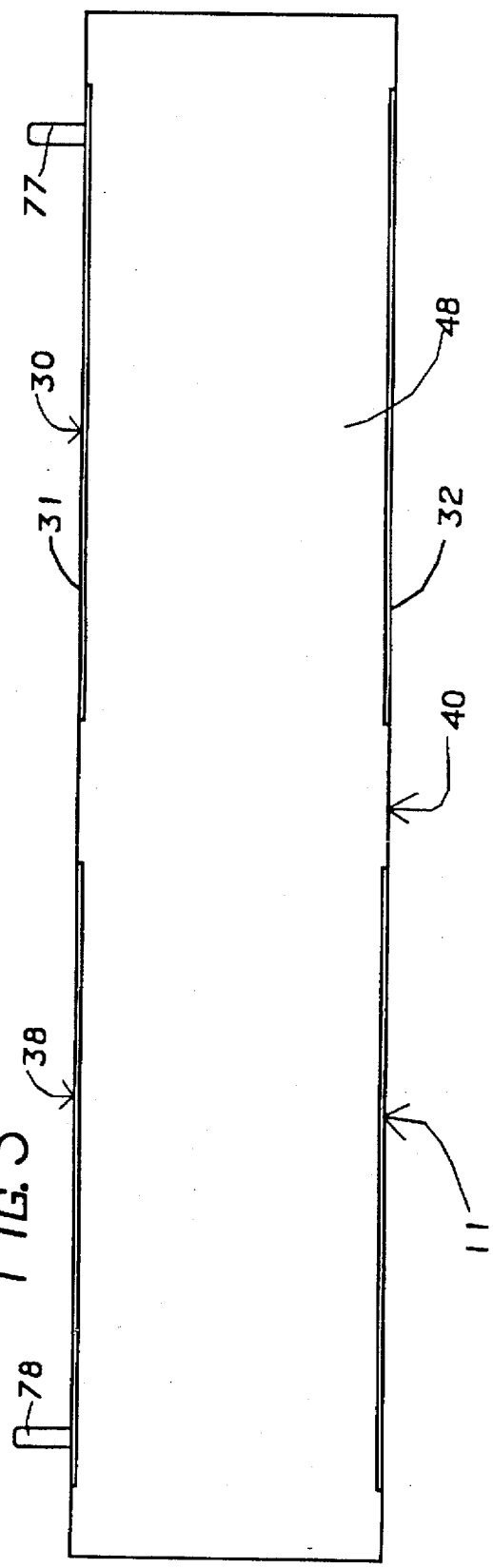

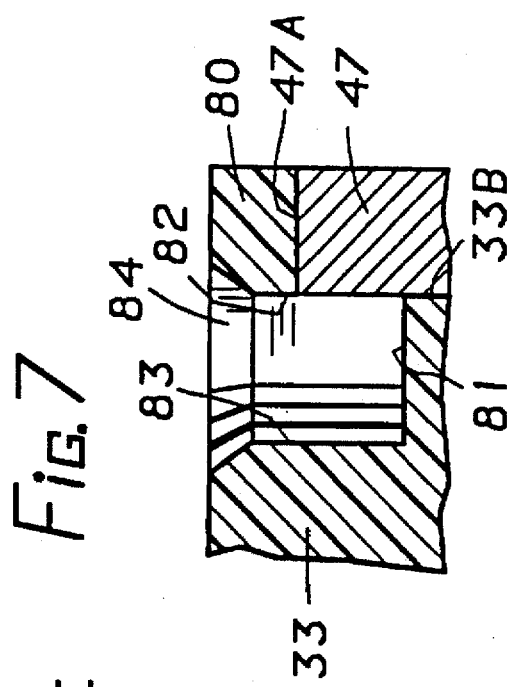
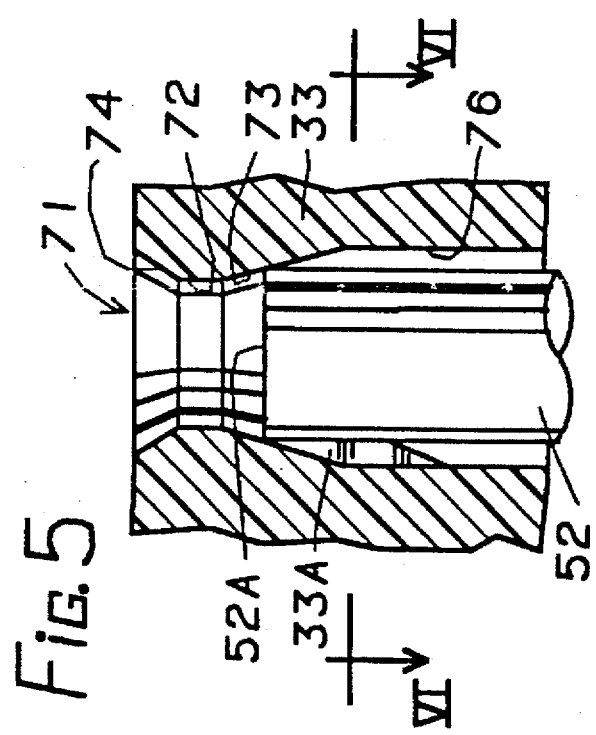
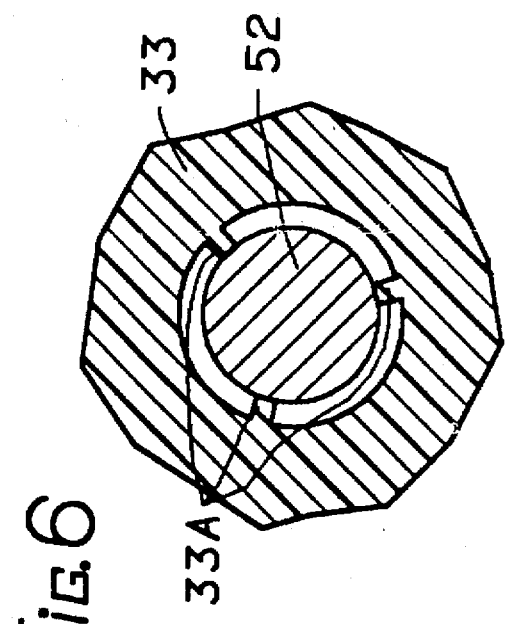

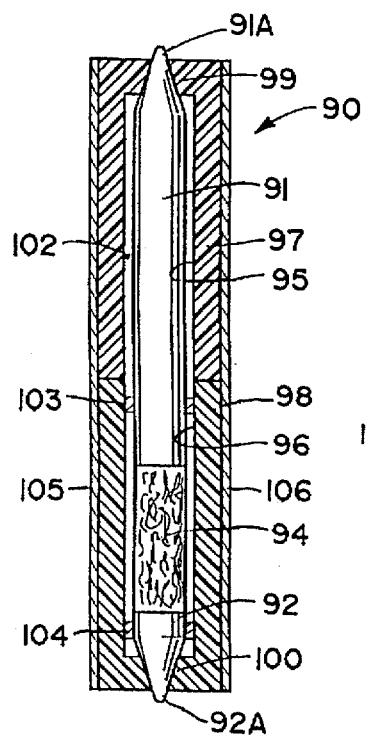
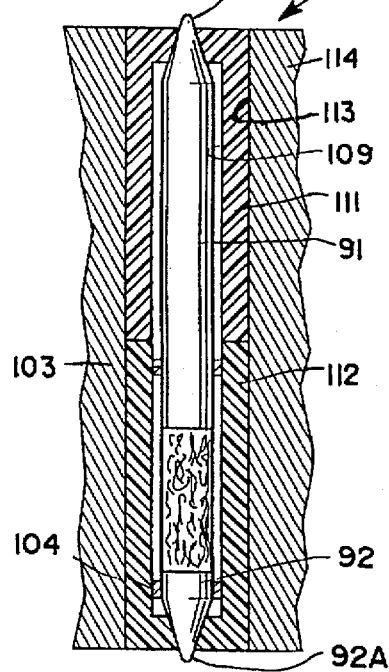
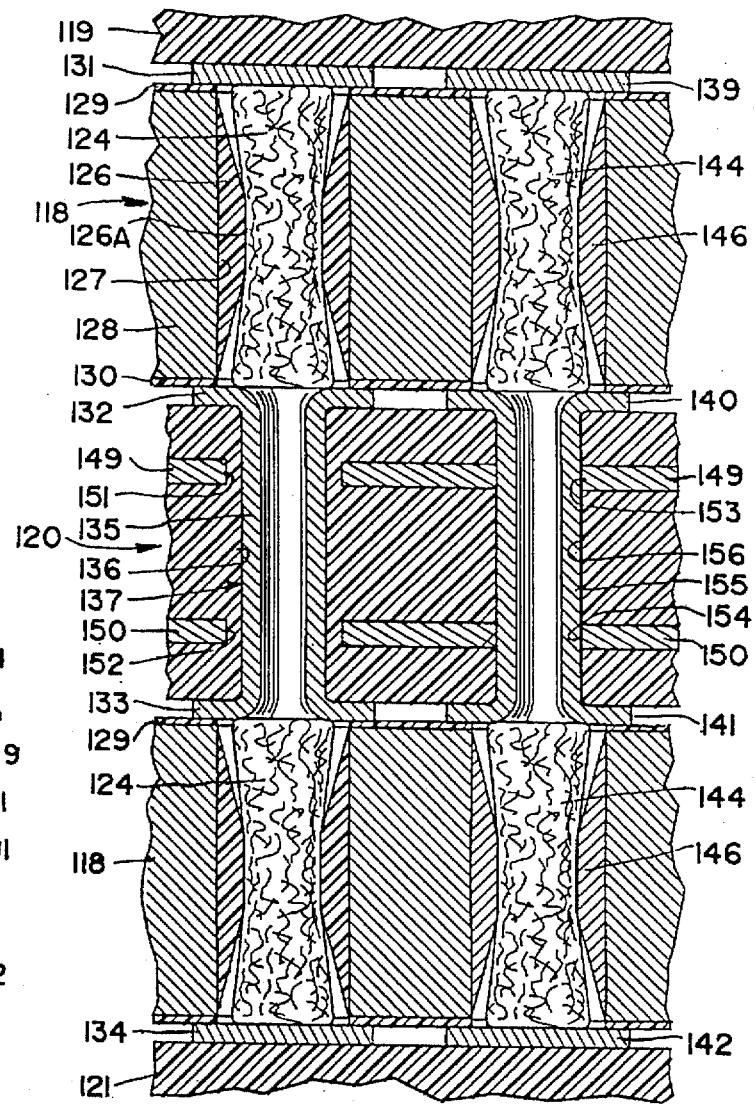

ELECTRICAL CONNECTORS

This is a continuation of application Ser. No. 647,865, filed Jan. 30, 1991 (now abandoned), that continues subject matter in the application of Albert Nicholas Hopfer, III and Richard Jay Lindeman, Ser. No. 352,499, filed May 16, 1989 (issued Jan. 29, 1991 as U.S. Pat. No. 4,988,306), and subject matter which is disclosed in the application of Richard Jay Lindeman, et al., Ser. No. 406,142, filed Sep. 12, 1989 (issued May 7, 1991 as U.S. Pat. No. 5,013,249). The application Ser. No. 406,142 continues subject matter disclosed in an application now abandoned of Richard Jay Lindeman, Ser. No. 297,303, filed Jan. 13, 1989 as a division of an application of Richard J. Lindeman, Ser. No. 947,317, filed Dec. 29, 1986 (issued Feb. 21, 1989 as U.S. Pat. No. 4,806,110). The application Ser. No. 947,317 continues subject matter of an application of Richard Jay Lindeman, filed Jun. 19, 1986, Ser. No. 876,179 (issued as U.S. Pat. No. 4,710,133 on Dec. 1, 1987). Said application Ser. No. 647,865 also continues subject matter disclosed in the application of Richard Jay Lindeman, Ser. No. 518,295, filed May 3, 1990 (issued Apr. 2, 1991 as U.S. Pat. No. 5,004,427), which continues subject matter of said application Ser. No. 297,303, and subject matter which is disclosed in the application of Richard Jay Lindeman and Saeed U. Zafar, Ser. No. 375,588, filed Jul. 5, 1989 (issued Feb. 12, 1991 as U.S. Pat. No. 4,992,053). Said application Ser. No. 406,142 also continues subject matter of said application Ser. No. 352,499 and said application Ser. No. 375,588. Said application Ser. No. 375,588 also continues subject matter of said application Ser. No. 352,499. The disclosures of said applications are incorporated herein by reference. This application also continues subject matter which is disclosed in my copending application Ser. No. 647,907, filed Jan. 30, 1991 (now abandoned in favor of a continuation thereof), each of which also continues subject matter of the other applications recited above.

BACKGROUND OF THE INVENTION

1. Field of the Invention

This invention relates to electrical connectors and more particularly to electrical connectors which are usable for installation between circuit boards or other components for propagation of high frequency signals as well as for transmission of electrical power, control or reference voltages therebetween. The connectors of the invention are readily installed and are highly efficient and reliable, while being readily and economically manufacturable.

2. Background of the Prior Art

Many different types of electrical connectors have heretofore been used or proposed in the prior art, including electrical connectors which utilize wadded conductor contacts or buttons which generally include "wads" of fine wire which are placed in holes in a carrier of insulating material in position to be compressed between the surfaces of a pair of conductors to be connected. Such conductive wads are advantageous in that they have very low resistance to current and also in that they have very low inductance and are otherwise advantageous for propagation of very high frequency signals.

However, arrangements of the prior art have left something to be desired, particularly with respect to signal transmission characteristics and with respect to providing low-loss, efficient and reliable transmission of signals between circuit boards.

SUMMARY OF THE INVENTION

This invention was evolved with the general object of improving upon the prior art and more particularly for providing connectors which can be readily used for low-loss transmission of signals between separated circuit boards or other components, while being efficient and reliable and manufacturable at reasonably low cost.

A further object of the invention is to provide connectors which have optimal electrical characteristics particularly with respect to efficient and reliable propagation of high frequency signals between circuit boards or the like.

This application continues subject matter of the aforementioned applications relating to features of a connector structure for propagating signals between very high speed integrated circuits, such features being operative to overcome problems discovered and recognized in connection with prior constructions. In particular, it was found that ground connections tend to develop electrostatic charges when attempts are made to propagate high volumes of such very high frequency signals at very high speeds. A shift in voltage between ground planes of two interconnected circuits may result in loss of reference levels in electronic circuitry, thus rendering computers and the like inoperative. Mismatched impedances between circuitry and connectors cause reflections and the production of undesirable standing wave phenomena, with corresponding errors in transmitting data, in the case of transmitting digital signals. It is also found that cross talk between signal paths increases with frequency and with decreases in spacing therebetween. This problem is affected to a substantial extent by the characteristics of the ground connection which is common to the signal paths. Inductive reactances for a given path length increase with frequency and if the ground connection has a substantial reactance, it can cause problems with high frequency signal propagation or high velocity pulse signal propagation. This had not been recognized because the ground paths of conventional connectors have inductive reactances which have not produced a problem when transmitting signals at relatively low frequencies.

Typically, one or more connector pins had been used in the past for ground connections and, in some cases, each pin used for signal transmission may have an associated adjacent pin used for a ground connection, in an attempt to minimize cross talk problems. It was found that such does not provide an adequate solution because there may nevertheless be substantial impedances in the ground connections and also, this solution requires many more connector pins. Moreover, if the number of ground pins were increased so as to use two or more pins for each signal pin, it would impose severe space limitations as well as increasing insertion forces.

Another problem of prior constructions related to the impedance characteristics of the signal paths. Each signal path of an electrical connector may be considered as an electrical transmission line having a certain characteristic impedance determined by its resistance, inductance and distributed capacitance per unit length. At relatively low signal transmission velocities, the actual impedance of the path is not usually important. However, at high velocities, the path may produce reflections, resonances and standing wave phenomena when there is a substantial mismatch between the characteristic impedance of the path and the characteristic impedances of the circuits connected thereto. It is also to be observed that it is especially desirable that the characteristic impedances of all paths be substantially the same, so as to facilitate design of the connected circuits.

In connectors as disclosed in the aforementioned prior applications, very high frequency signals are propagated from one circuit to another through a plurality of contact elements which are disposed in spaced parallel relation and a conductive ground path is provided in spaced parallel relation to each of the contact elements, the ground path being of very low inductance and resistance which provides a very low impedance and which prevents the build-up of any potential difference between the interconnected circuits. The result is a very substantial increase in the speed and volume of data transmission which can be accommodated in a connector of a given size. The arrangement also minimizes common ground path impedances and cross-talk effects between adjacent signal paths. Another feature of the connectors of the aforementioned prior applications relate constructions which are such as to achieve a uniform characteristic impedance with the characteristic impedances of all paths being substantially the same so as to facilitate design of the connected circuits. A further feature relates to the use of a plurality of ground conductors which need not be connected directly together but which are so connected electrically as to provide a very low AC impedance between each such ground conductor and each other ground conductor. Such conductors may be used with each other and/or with an outer shell for transmission of DC supply voltages, reference voltages or on-off control voltages or for other purposes, without an adverse effect on the propagation of very high frequency signals through the signal elements.

This application also continues subject matter of the aforementioned prior application U.S. Ser. No. 352,499 relating to button board configurations in which a large number of specially shaped holes are provided into which wadded conductor elements can be readily inserted. As disclosed, conductive interconnect means are provided in which conductors of circuit boards are directly engaged by both ends of a wadded conductor element or in which such wadded conductor elements used in combination with slug or plunger elements with a circuit board conductor being engaged either with a wadded conductor element or with an end of a slug or plunger element with the resilience of the wadded conductor element being effective to develop a pressure sufficient to insure a low resistance electrical contact.

This application also continues subject matter of the aforementioned prior application U.S. Ser. No. 406,142 relating to connectors which may be sandwiched between stacked circuit boards and to features of construction in which resilient elements such as resilient wadded elements are used in providing conductive interconnect means to propagate very high frequency signals between circuit boards with a conductive ground being provided in adjacent relation to each conductive interconnect means.

Further features of the invention relate to constructions which achieve the advantages of the constructions of the aforementioned prior applications while achieving additional important advantages, especially in connection with providing a propagation paths in large numbers and/or in high density relation in connectors of small size and in connection with facilitating the connection of a plurality of circuit boards in stacked relation.

In accordance with the invention, connectors are provided for propagation of electrical signals in a plurality of propagation paths between circuits connected to conductive pads of circuit boards, each circuit presenting a certain characteristic impedance at a pad connected thereto. For example, a connector may be sandwiched between opposed faces of a pair of circuit boards, a plurality of the connectors being usable in providing signal propagation paths between circuits of a stack of circuit boards. Each connector includes a plurality of resilient and electrically conductive signal-propagating interconnect means having opposite ends engageable with conductive pads on a pair of the circuit boards. Such conductive interconnect means, each of which may include a resilient wadded element, are supported by insulating means of a support structure which provides conductive ground means in adjacent relation to each opening and to the conductive interconnect means supported therein, the conductive ground means being arranged for connection to grounding elements of the circuit boards. In accordance with important features of the invention, the configuration and characteristics of the ground conductor means and the insulating means in relation to each signal-propagating interconnect means are such as to obtain a certain characteristic impedance for matching the characteristic impedances of circuits interconnected by each signal-propagating interconnect means.

In embodiments designed for general application, the configuration and characteristics of the ground conductor means and the insulating means in relation to substantially all of said signal-propagating interconnect means are the same to obtain the same characteristic impedance for substantially all of said signal-propagating interconnected means. This feature is generally desirable in facilitating the design of circuit boards to be interconnected. In accordance with the invention, however, the configuration and characteristics may be such as to obtain different impedances in certain paths as may be desired in particular circumstances.

Specific features relate to configuring of ground conductor means and insulating means in relation to signal-propagating interconnect means which are of elongated form and which may include, for example, solid elements in combination with wadded contact elements. The characteristic impedance is maintained substantially constant along the length of such elongated interconnect means to insure against undesirable reflections, resonances and standing wave phenomena.

Further specific features relate to configuring the ground conductor means and insulating means in relation to at least some of said signal-propagating interconnect means such as to provide both air and solid dielectric material between said signal-propagating interconnect means and said ground conductors so proportioned as to obtain characteristic impedances for matching the characteristic impedances of interconnected circuits.

This invention contemplates other objects, features and advantages which will become more fully apparent from the following detailed description taken in conjunction with the accompanying drawings.

BRIEF DESCRIPTION OF THE DRAWINGS

FIG. 2 is a top plan view of one of the connectors of FIG. 1;

FIG. 3 is a front elevational view of the connector of FIG. 2;

FIG. 5 is a cross-sectional view of a portion of the connector of FIG. 2 on an enlarged scale, showing details of a button-receiving cavity of an insulator member of the connector;

FIG. 6 is a cross-sectional view taken substantially along line VI—VI of FIG. 5; and FIG. 7 is a cross-sectional view similar to FIG. 5, but showing details of a button-receiving cavity of an insulator member and its relationship to an upper edge portion of the side wall of a casing.

FIG. 8 is a cross-sectional view illustrating another form of connector constructed in accordance with the invention;

FIG. 9 is a cross-sectional view illustrating similar to FIG. 8 but a modified form of connector constructed in accordance with the invention; and FIG. 10 is a cross-sectional view illustrating a further form of connector constructed in accordance with the invention and shown installed in a stack of circuit boards.

DESCRIPTION OF PREFERRED EMBODIMENTS

Figure 1:
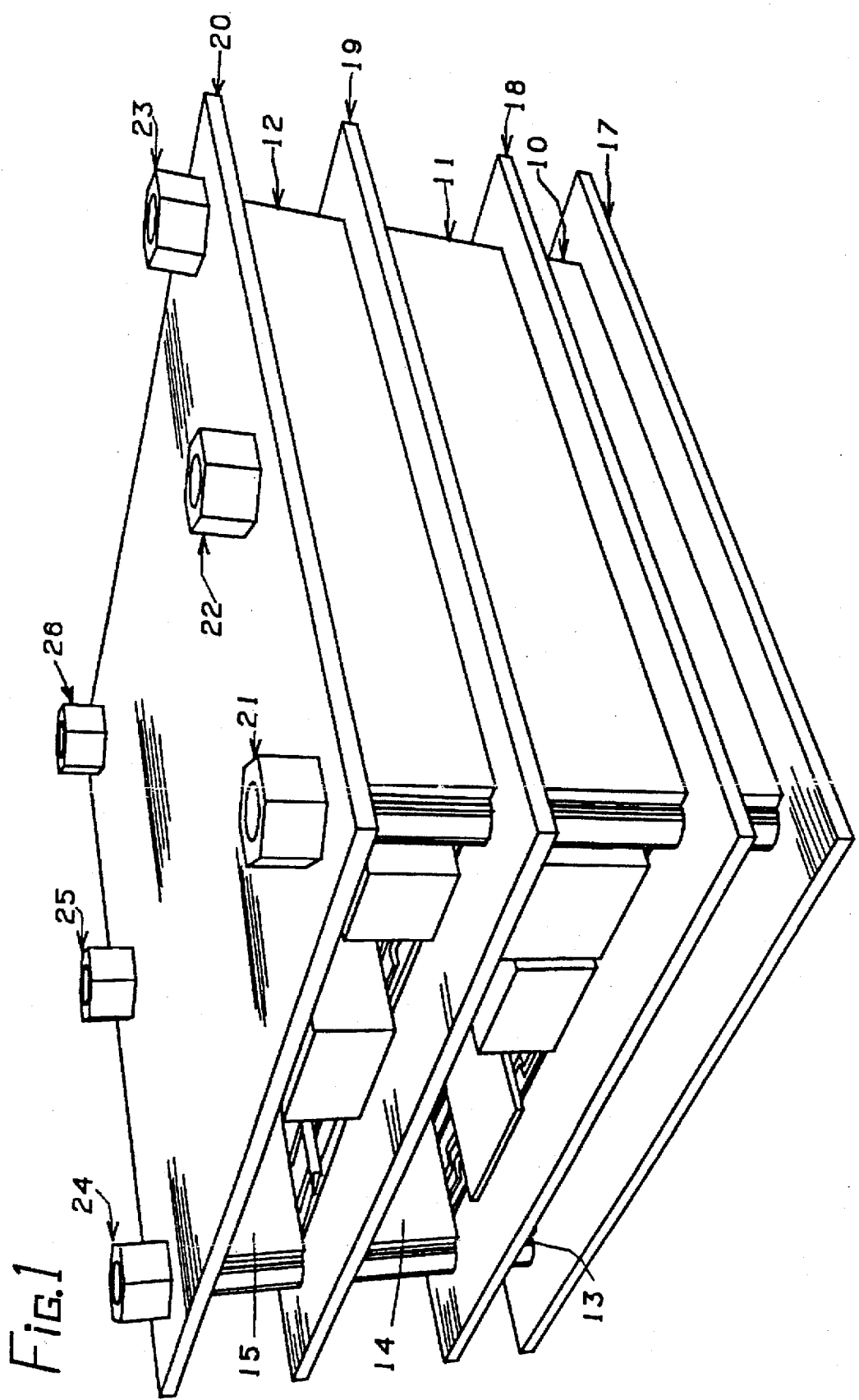
FIG. 1 is a perspective view showing electrical connectors of the invention installed in a circuit board assembly.

FIG. 1 shows six connectors 10-15 which are constructed in accordance with the principles of the invention and which are shown mounted in a circuit board assembly 16. The assembly 16 includes four circuit boards 17, 18, 19 and 20 which are mounted in a stack and which are secured together by six bolts 21-26.

The connectors 10-15 function to interconnect circuits on the boards 17-20 and also function as spacers between the boards, being installed in three pairs between edge portions of the boards, as shown. The connectors of the invention are advantageous in providing short length signal propagation paths between the boards which are shielded and isolated as required and which are of uniform impedance and otherwise highly efficient. In addition, the connectors serve to couple DC and low frequency AC voltages between the circuit boards, and a very compact assembly is achieved. As is also shown, the vertical dimensions of three pairs of connectors are different, being selected in accordance with the vertical extent of components on the boards 11-14. As illustrated, the connectors 10 and 13 have relatively small vertical dimensions while the connectors 11 and 14 and connectors 12 and 15 have larger vertical dimensions.

Figure 4:
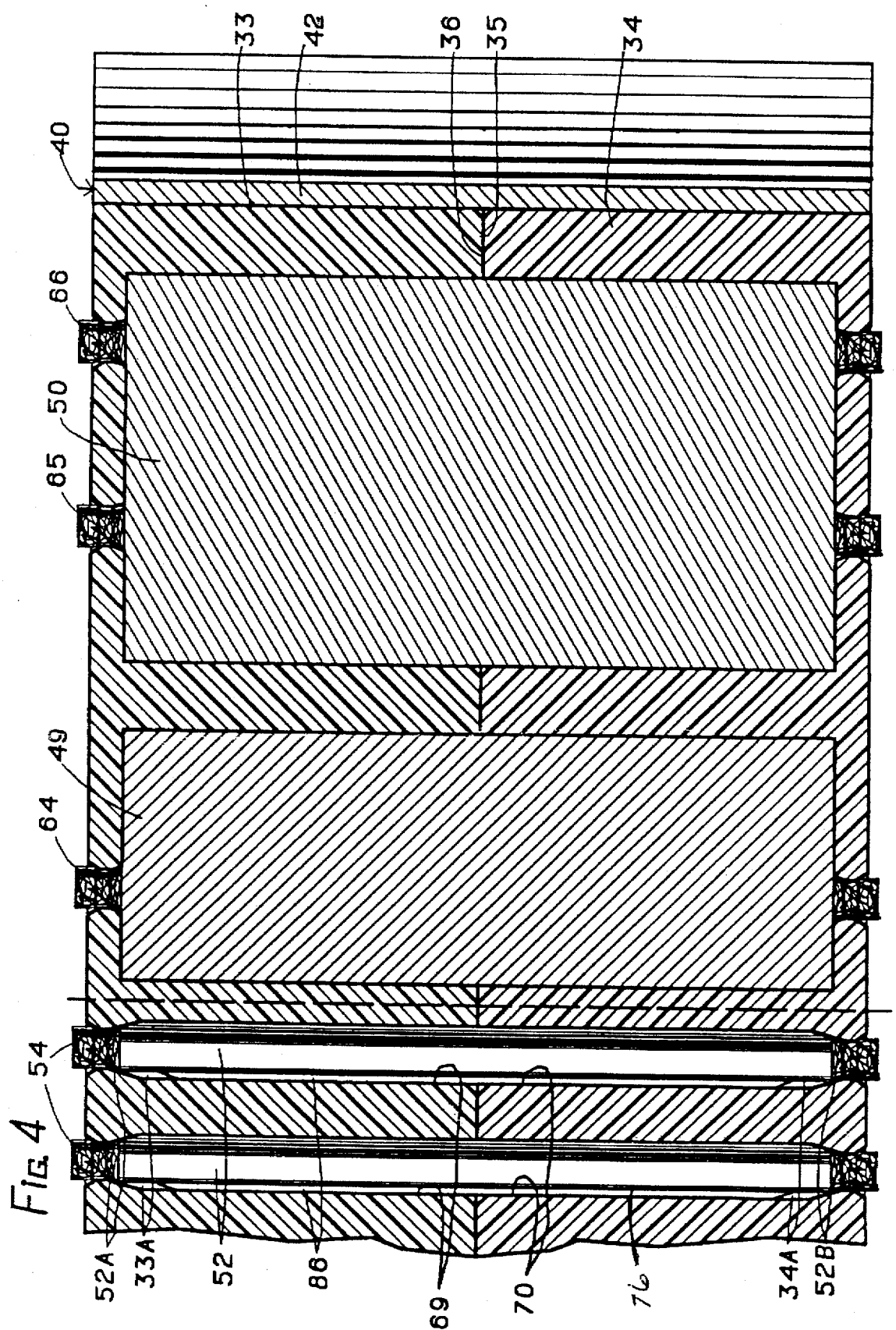
FIG. 4 is a sectional view taken substantially along line IV—IV of FIG. 2.

FIGS. 2 and 3 are respectively top plan and side elevational view of the connector 11, and FIG. 4 is a sectional view taken substantially along line IV—IV of FIG. 2. It will be understood that the constructions of the other connectors 10 and 12-15 may be like that of the connector 11, except that the connectors 10, 12, 13 and 15 may have different vertical dimensions. The connector 11 includes a block 30 which is of insulating material and which has upper and lower planar surfaces 31 and 32. Block 30 is preferably formed by upper and lower members 33 and 34 respectively having lower and upper surfaces 35 and 36 engaging in a plane which is midway between the surfaces 31 and 32 in the illustrated connector but which may be positioned at unequal distances from the surfaces 31 and 32.

In the illustrated connector 11, a second block 38 of insulating material is provided which is substantially the same as the block 30 and which is also formed by two members like the members 33 and 34 which form the block 30. The two blocks 30 and 38 are mounted within a casing 40 of conductive material which includes end portions 41 and 42 formed with guide slots 43 and 44 to receive shank portions of bolts 21 and 23 and a central portion 45 which is between blocks 30 and 38 and which has a hole 46 therethrough to receive the shank portion of bolt 22. The casing 40 also includes side walls 47 and 48, the wall 48 being shown in the side elevational view of FIG. 3 and a portion of the upper block member being shown broken away in FIG. 2 to show a portion of the opposite side wall 47.

Important features relate to the provision of a central ground plane which is formed in part by plates 49 and 50 of conductive material in block 30 as shown in FIG. 4. Only a portion of plate 49 is shown in FIG. 4 since FIG. 4 is an offset sectional view. A portion of the block member 33 is shown broken away in FIG. 2, to show that the plate 49 extends to an end edge in proximity to the inner end of block 30 and to the central portion 45 of the casing 40. Similar plates are provided in the block 38 to define a central ground plane thereof. The plates 49 and 50 are insulated from the casing 40 but the plates 49 and 50 as well as the casing 40 are connectable directly or through by-pass capacitors to ground conductors of the circuit boards 18 and 19, so as to be at ground potential with respect to propagation of high frequency signals. Plates 49 and 50 and corresponding plates within the block 38 thus provide a substantially continuous ground plane. At the same time, since the plates 49 and 50 are electrically insulated from one another and from the casing 40 they may be used with the casing for conducting DC and low frequency AC voltages between the circuit boards 18 and 19.

A plurality of elongated conductive slugs 52 are provided within the blocks 30 and 38 for propagation of signals between the circuit boards 18 and 19, two of such slugs 52 being shown in FIG. 4. To connect upper and lower ends of such slugs to conductors of the circuit boards 18 and 19, compressible conductive buttons are provided. In the illustrated construction, such conductive buttons include two rows of buttons 53 and 54 at the upper ends of two rows of slugs in a first pair planes which are indicated by broken lines 55 and 56 and which are on opposite sides of the central ground plane defined by plates 49 and 50. Two additional rows of buttons 57 and 58 are provided at the upper ends of an additional two rows of slugs which are in a second pair of planes which are indicated by broken lines 59 and 60 and which are on opposite sides of the central ground plane and between the first pair of planes 55 and 56 and the opposite side walls 47 and 48 of the casing 40.

A row of conductive buttons is also provided to connect upper edges of the plates 49 and 50 to conductors on the circuit board 18, including four buttons 61-64 engaged with the upper edge of plate 49 and two buttons 65 and 66 engaged with the upper edge of plate 50. Additional rows of conductive buttons 67 and 68 are engaged with upper edges of the side walls 47 and 48 of the casing 40.

Important features relate to the achievement of a uniform characteristic impedance for all signal propagation paths through the conductive slugs of the connector. In the illustrated construction the distance from the slugs of the first pair of planes 55 and 56 to the plates 49 and 50 is substantially equal to the distance from the slugs of the second pair of planes 59 and 60 to the side walls of the casing 40. It follows that the distance from the slugs of the first pair of planes 55 and 56 to the side walls 47 and 48 of the casing is equal to the spacing from the slugs of the second pair of planes 59 and 60 to the-plates. Thus the relationship of each slug to planar surfaces of conductive material which are usable to provide circuit grounds is the same as that of each of the other slugs. In addition, the slugs are mounted in a uniform manner and with a uniform spacing from each slug to slugs adjacent thereto. The result is that uniform characteristic impedances are obtained. Preferably, the slugs in the first pair of planes 55 and 56 are in staggered relation to those of the second pair of planes 59 and 60, so as minimize the width of the connector while obtaining a uniform and desired spacing between each slug and slugs adjacent thereto.

The conductive buttons 53, 54, 57 and 58, 61-66, 67 and 68 are mounted in cavities in the upper surface 31 of the upper member 33 of block 30 for engagement with the conductive pads on the underside of the circuit board 19 and corresponding series of conductive buttons are mounted in cavities in the lower surface 32 of the lower member 34 of block 30 for engagement with the conductive pads on the upper side of the circuit board 18. Each of the buttons may typically be in the form of an elongated cylindrical contact element comprising a resiliently and randomly wadded thin gauge electrically conductive wire. Such buttons provide low impedance connections when proper contact pressures are maintained between such buttons and contact surfaces engaged thereby.

Two of the slugs 52 are shown in the offset sectional view of FIG. 4, having upper ends in the plane 56 and engaged with two of the buttons 54. Each slug 52 is positioned in an opening in the block 30 which is defined by aligned openings 69 and 70 in the upper and lower members 33 and 34, each slug being so positioned that terminal upper and lower end surfaces thereof are respectively spaced at substantially equal distances below and above the upper and lower surfaces 31 and 32 of the block 16 to provide cavities which receive one of the buttons 54 and a corresponding button 54A at the upper face of the connector at the lower face of the connector. Only a cavity 71 at the upper end of one of the illustrated slugs 52 will be described in detail, the cavity at the lower end and other cavities of the connector being of substantially the same form.

The cavity 71 in the upper member 33 has an "hour glass" shape and is defined by surface portions which include an intermediate neck portion 72, an inner flared portion 73 and an outer flared portion 74. The remainder of the opening 69 in the upper member 33 is defined by a right cylindrical surface portion 76 which extends downwardly from the lower end of the inner flared portion 73 to the lower surface of the member 33.

The neck portion 72 has a very small axial dimension and applies a localized compressive pressure to the button 54 when installed to securely hold the button 54 in place while allowing free resilient axial compression of the button 54 to obtain reliable low resistance connections. The inner flared portion 73 provides an expansion region into which a lower portion of the button expands when the button is installed, to additionally insure the secured holding of the button in place while allowing free resilient axial compression thereof. The outer flared portion 74 facilitates installation of the button and avoids entrapment of any protruding fine wire portions of the button between facing surfaces of the connector and circuit board. It also facilitates the free axial compression of the button when installed and accommodates any slight transverse relative shifting movements of the connector and circuit board as may occur during or after assembly. It preferably is of very smooth form, facilitating installation of the buttons and avoiding sharp edges which might catch and cause entrapment of protruding wire portions of the buttons.

In assembling the connector, the members 33 and 34 are moved together while positioning the plates 49 and 50 to enter openings in the block members 33 and 34 and while positioning the slugs 52 to enter the openings of the members 33 and 34 at the interengageable lower and upper surfaces 35 and 36 thereof, so that the slugs 52 do not pass through the cavity-defining surfaces. The plates 49 and 50 and the slugs 52 may preferably be installed with a press fit using fixtures to obtain accurate positioning thereof. Terminal end portions of the slugs 52 are engaged by sets of protrusions 33A and 34A which are formed as integral parts of the block members 33 and 34 and which extend radially inwardly into localized pressure engagement with the slugs 52. FIG. 6 shows three protrusions 33A in 120 degree arcuately spaced relation and forming one set and each other set of protrusions may be formed in a similar manner. The protrusions 33A and 34A hold the slugs in centered relation in the openings 69 and 70 and provide for air gaps along the length of the slugs and for impedance control in accordance with important features of the invention as hereinafter described. Other equivalent means may be used to hold the slugs in centered relation and to provide air gaps along the length of the slugs. For example, collars may be provided on the slugs 52, either as separate members or as integral parts of the slugs 52, as shown for example in the aforesaid prior application Ser. No. 07/375,588.

When the slug 52 is installed as shown in FIGS. 3 and 4, its upper terminal end surface, indicated by reference numeral 52A, is positioned below the lower end of the neck portion 72 and its opposite terminal end surface 52B is similarly positioned with respect to the corresponding surface of a cavity at the lower side of the connector, thereby providing the aforementioned expansion regions. The block members 33 and 34 may be secured together by any suitable means, such as through the use of an adhesive at the interengaging surfaces 35 and 36.

After assembly of the block members 33 and 34 and the slugs 52, the buttons 53, 54, 57 and 58, 61–66, 67 and 68 are installed in the respective cavities which are provided above and below the slugs 52, the plates 49 and 50 and above upper edge portions of side walls of the casing 40. In its initial nominal or unstressed condition, each button may be of generally right cylindrical shape with a diameter substantially less than that of the outer flared portion 74 and only slightly greater than that of the neck portion 72, sufficient to securely hold the button in place while allowing free axial compression thereof to obtain electrically efficient contact pressures.

To facilitate assembly of the connector 11 with circuit boards, a pair of alignment pins 77 and 78 are press fitted into holes in the block 30 to project upwardly from block 30 and from block 38 and to extend into alignment holes of circuit board 18. The pins 77 and 78 may extend through the circuit board 18 and into alignment holes of blocks of the next higher connector 12. Similar pins may be installed to project from the opposite lower face of a connector, if desired. After assembly of all connectors in the assembly of FIG. 1 the nuts of the bolts 21–26 are tightened to compress all conductive buttons of the connectors 10–15 into pressure engagement with conductive pads of the circuit boards 17–20 and to obtain stable and reliable electrical contact therewith.

As is shown in FIG. 7, a modified type of cavity is provided for receiving the buttons 67 and 68 which engage the upper edges of casing side walls. The upper block member 33 has a pair of outwardly protruding lip portions at its upper end which extend over upper terminal edges of casing side walls, one of such protruding lip portions 80 being disposed over the upper edge 47A of the casing side wall 47 as shown in FIG. 6. A cavity adjacent thereto includes a bottom surface 81 which is below the upper edge 47A of the casing side wall 47, a surface 82 which is aligned with a side surface 33B of the upper block member 33, a surface 83 which is partly of cylindrical form, an upper portion thereof extending to ends of the surface 82, and an outer surface 84 of beveled form. When a button is pressed into the cavity formed by the surfaces 81, 82, 83 and 84, a lower portion of the button is resiliently compressed in a side-wise direction into firm engagement with an upper inside surface portion of the casing side wall 47.

Further important features of the invention relate to the control of characteristic impedances in the signal propagation paths through the connector 11. In using the connector, the upper and lower end edges of the casing side walls 47 and 48 and the upper and lower end edges of the plates 49 and 50 are connected through conductive buttons to circuit board pads which are connected directly or through by-pass capacitors to ground, the casing side walls and the plates 49 and 50 thereby defining ground planes for the purpose of propagation of high frequency signals. Each of the slugs 52 is disposed between a pair of such ground planes and cooperates therewith to define a propagation path which has a substantially uniform cross-sectional configuration along its length and which thereby has a uniform characteristic impedance. A uniform characteristic impedance is highly desirable for the reason that undesirable reflections of energy, the development of standing waves, and attenuation of signals along the length of the paths are avoided. It is also found to be highly desirable that the characteristic impedances of the signal paths provided by the slugs be matched to characteristic impedances which are provided at the conductive pads of the interconnected circuit boards, circuit components on the boards and traces on the boards interconnecting such traces to the conductive pads. It is possible for the circuit board designer to so design a board as to obtain desired characteristic impedances at pads at which the efficient and reliable propagation of high frequency signals is critical. For this reason, it is found to be desirable that the characteristic impedance of each slug of the connector be known. Design is particularly facilitated by providing all slugs with the same characteristic impedance.

The characteristic impedance of a transmission line having uniform characteristics along its length is equal to the square root of the ratio of the series impedance per unit length to shunt admittance per unit length. At higher frequencies, the resistive terms of the series impedance and shunt admittance expressions are quite small and the characteristic impedance can be assumed for practical purposes to be equal to the square root of the ratio of the inductance per unit length to the capacitance per unit length. The inductance per unit length of a round conductor in parallel relation to ground planes is a function of its diameter and its spatial relationship to such ground planes. The capacitance per unit length of a conductor in parallel relation to ground planes is a function of the dielectric constant of the medium between the conductor and the ground planes. The spacing between adjacent slugs in the illustrated embodiment is 0.1 inches, the other dimensions being in the same proportions as illustrated in the drawings.

In accordance with the invention, an air space as indicated by reference numeral 86 is provided between outside surfaces of each slug 52 and the internal surfaces which are provided by the openings 69 and 70 in the block members 33 and 34. To permit assembly of the block members 33 and 34 in the casing 40 and assembly of plates 49 and 50 in the block members the relative dimensions are such that there are also air spaces between inside surfaces of the side walls 47 and 48 of casing 40 and the block members 33 and 34 of insulating material as well as between the surfaces of the plates 49 and 50 and the block members 33 and 34. The effect is to provide three capacitances in series relation to each other and in shunt relation to the propagation path, one being that provided by the air space 86, another capacitance being provided by the dielectric material of the block members 33 and 34 and a third capacitance being provided by air spaces between the block members 33 and 34 and the casing side walls 47 and 48 and the plates 49 and 50. The dielectric constant of air is essentially unity while the dielectric constant of the block members is substantially higher. By controlling the dimensions of air spaces along the slugs 52, specifically by designing particular dimensions for the air space and the dielectric, between the ground and the interconnected path defined by the slug and buttons, any desired characteristic impedance within a wide range may be obtained with any dielectric material having a given dielectric constant. In addition, by using the same dimensions for the air spaces for all slugs and by using the same relationships of all slugs to the adjacent ground planes as aforementioned, all slugs may provide paths of the same characteristic impedance to facilitate design of circuit boards to be interconnected.

In the illustrated construction, the slugs are of cylindrical shape and the protrusions 33A and 34A serve to accurately position each slug 52 in centered relation but any equivalent shape and locating means may be employed.

FIG. 8 illustrates another form of connector 90 which utilizes impedance control concepts of the invention. As shown, an interconnect device is provided which includes an assembly of two reciprocably movable plungers 91 and 92 and a resiliently compressible conductive button 94, the assembly being mounted in an opening formed by aligned openings 95 and 96 in two block members 97 and 98 of an insulating dielectric material which form a block and which are similar to the block members 33 and 34 of the connector 10. The plungers 91 and 92 have terminal end portions 91A and 92A of reduced diameter and the block members 97 and 98 are formed with reduced diameter neck portions 99 and 100 at the upper and lower ends of the openings 95 and 96, such that only the terminal end portions 91A and 92A of plungers 91 and 92 project upwardly and downwardly from the upper and lower members 97 and 98 as illustrated. Thus the two plungers and the intervening button form a resiliently compressible signal propagating interconnect path assembly which is captured and retained in the assembled block members 97, 98. It will be understood that when the connector 90 is assembled between a pair of circuit boards (not shown), end portions 91A and 92A are urged by the resiliency of the conductive button 94 into pressure engagement with conductive pads on the lower and upper faces of the circuit boards.

In accordance with the invention, the outside diameter of the plungers 91 and 92, except for the reduced diameter end portions 91A and 92A, and the outside diameter of the button 94 are less than the inside diameter of the aligned openings 95 and 96 so as to provide an air space 102 similar to the air space 86 of connector 10, shown in FIG. 4, whereby preselected impedance values may be obtained by selection of the air spacing.

In the illustrated construction, the length of the lower plunger 92 is substantially less than that of the upper plunger 91 which is found to be desirable to facilitate assembly. Centering elements such as elements 103 and 104 as shown may optionally be provided. It is also noted that the position of the assembly may be reversed to place the shorter plunger at the top and to avoid adverse effects of gravity.

The members 97 and 98 as shown in FIG. 8 are mounted between two walls 105 and 106 of conductive material, such as aluminum, which are connected to ground pads of circuit boards as through conductive buttons similar to those used in the connector 11. FIG. 9 illustrates a modified connector 108 in which the interconnnect assembly formed by plungers 91 and 92 and button 94 is mounted in an opening formed by openings 109 and 110 in two members 111 and 112 which are similar to the block members 97 and 98 but which are inserted into an opening 113 in a member 114 of conductive material such as aluminum. It will be understood that in the connector 90 a plurality of plunger-button-plunger assemblies may be mounted in one or more rows between the walls 105 and 106. Similarly a plurality of plunger-button-plunger assemblies and associated insert members 111 and 112 may be mounted in openings in the conductive member 114 of the connector 108 in rows, or in any desired pattern.

FIG. 10 illustrates an arrangement including two connectors 118 which have the same construction and which are mounted to interconnect circuits in a stack of circuit boards including boards 119, 120 and 121 as illustrated, the upper one of the illustrated connectors 118 being sandwiched between boards 119 and 120 and the lower connector one of the illustrated connectors 118 being sandwiched between boards 120 and 121. In each connector 118, one or more signals are propagated through one or more of a plurality of resilient conductive interconnect devices, only one signal propagating device being shown in each of the illustrated connectors.

In each illustrated connector 118, each signal propagating device is formed by a single button 124 which is mounted in an insert 126 of a dielectric insulating material which has a reduced diameter neck portion 126A and which is mounted in an opening 127 in a support member 128. Support member 128 is of conductive material and may preferably be in the form of a plate having additional openings for receiving as many additional inserts and signal propagating devices as may be desired in any particular application. Layers 129 and 130 of insulating material are provided on the upper and lower surfaces of the support member 128 to prevent direct contact between the member and traces or pads of circuit boards.

An arrangement is shown for effecting signal propagation between circuits of the upper and lower boards 119 and 121, the illustrated portion of intermediate board 120 being used only to provide a path for such signal propagation. The intermediate board 120 as well as the boards 119 and 120 may, of course, also include operative circuit components. As shown, the upper and lower ends of the button 124 of the upper connector 118 are engaged with a conductive pads 131 on the lower surface of the upper circuit board 119 and a conductive pad 132 on the upper surface of the intermediate circuit board 120. Similarly, the upper and lower ends of the button 124 of the lower connector 118 are engaged with a conductive pad 133 on the lower surface of the intermediate circuit board 120 and a conductive pad 134 on the upper surface of the lower circuit board 121. In the intermediate circuit board 120, the pad 132 is connected to the pad 133 through a conductor 135 which may, for example, be a "plated-through hole" conductor formed by plating the inside of an opening 136 and to provide a conductive device 137 formed by an integral connection between pads 132 and 133, as shown. With pads 131 and 134 connected to circuits on the boards 119 and 121, signals may be propagated therebetween through the buttons 124 and through the conductive device 137 formed by conductors 132, 133 and 135.

The support members 128 of the two connectors 118 are connected to ground through a grounded pad 139 of the upper circuit board 119, grounded pads 140 and 141 of the intermediate circuit board 120 and a grounded pad 142 of the lower circuit board 121. For this purpose each connector 118 may have at least one button 144 which, as shown, may be mounted in an insert member 146 which is installed in an opening 147 of the member 128 and which is similar to the insert member 126 except that it is of a conductive material to provide a direct electrical connection between the member 128 and an intermediate portion of the button 144. Insert members 146 may be integral with the members 128 if desired. The upper and lower ends of the button 144 of the upper connector 118 are engaged with and thereby connected to the grounded pads 139 and 140 and the upper and lower ends of the button 144 of the lower connector 118 are engaged with and thereby connected to the grounded pads 141 and 142.

With this arrangement, inside surfaces of ground conductors are provided at the inside surfaces of the opening 127 of each connector 118 along the signal propagating button 124 thereof. By using an insert 126 having an appropriate relationship between its dielectric constant and its dimensions, an L/C ratio may be obtained to match the characteristic impedance of the paths through the buttons 124 of the connectors 118 to that of the paths to which the pads 131 and 134 are connected.

It may also be important to match the characteristic impedance of the path through conductor 135 of the intermediate board 120 to that of the connectors 118 and the circuit boards 119 and 121. For this purpose, the grounded conductors are provided in adjacent relation to the conductor 135 of the device 137 of the intermediate board. In the illustrated arrangement, the intermediate board 120 includes two ground plates 149 and 150 disposed in spaced parallel relation to each other and to the upper and lower surfaces of the circuit board 120 and having openings 151 and 152 through which the conductor 135 extends, the diameters of the openings 151 and 152 being greater than the outside diameter of the conductor 135 which is thereby insulated therefrom. For connection to the grounded pads 140 and 141, the plates 149 and 150 have additional openings 153 and 154 which receive and are electrically connected to a conductor 155 having upper and lower ends connected to the grounded pads 140 and 141. The conductor 155, like the conductor 135, may be a "plated-through hole" conductor formed by plating the inside of an opening 156 and to provide a conductive device 157 which is formed by an integral connection between pads 140 and 141 and which is directly connected to the ground plates 149 and 150.

Ground plates similar to the ground plates 149 and 150 may be provided in the circuit boards 119 and 121. Traces on the surfaces of each board may cooperate with the ground plates to provide signal propagation paths which have characteristic impedances determined by the size of the traces, the spacing from the ground plates and the dielectric constant of the insulating material of the circuit board. As aforementioned, the characteristic impedance of the paths through the signal propagating buttons 124 of the connector devices 118 may be matched to that of the traces to which the pads 131 and 134 are connected. By control of the dimensions of the conductor 135 and the openings 151 and 152 in the ground plates 149 and 150 and of the dielectric material of the intermediate circuit board 120, the path through the conductor 135 may have substantially the same characteristic impedance, to minimize reflections, resonances and standing wave phenomena. This feature is particularly important when the signal path extends through a larger number of circuit boards. In the illustrated arrangement, the signal path is through only one intermediate board, but it will be understood that a path may extend through more than one intermediate board of a stack of boards which are interconnected by the connectors of the invention.

Other arrangememts for matching the characteristic impedances between the respective signal propagating paths can be effected, with or without the use of the impedance determining features of the illustrated embodiments of this invention at each propagating path. For example, the grounding conductors may be ground planes and components such as illustrated and described in the various prior applications referred to at the beginning of this specification, or may be a plurality of individual grounding conductors such as plated-through-hole conductors or other essentially linear conductors in appropriate parallel disposition around each signal propagating assembly, e.g. as illustrated in my co-pending application being filed concurrently herewith.

It will be understood that modifications and variations may be effected without departing from the spirit and scope of the novel concepts of this invention

What is claimed is:

1. A method of providing connections between conductors of a plurality of stacked circuit boards to provide paths for signal propagation between circuits on said boards having a certain characteristic impedance, the steps of providing for installation between each board and a board adjacent thereto a connector including support means arranged to receive and support compressively resilient and electrically conductive signal-propagating interconnect means for pressure engagement of opposite ends of the signal-propagating interconnect means with conductive pads of the circuit boards, providing such signal-propagating interconnect means in openings through said support means, providing ground conductor means in the support means having portions in adjacent relation to the signal-propagating interconnect means, providing ground connection means for connecting the ground conductor means to ground conductors of interconnected circuit board circuits, providing insulating means of dielectric material included in the support means for supporting the signal-propagating interconnect means within the openings therein and in electrically insulated relation to adjacent portions of the ground conductor means, and providing configuration and characteristics of the ground conductor means and the insulating means in relation to each signal-propagating interconnect means such as to obtain a certain characteristic impedance which matches the characteristic impedances of the circuits of the circuit boards interconnected by each signal-propagating interconnect means.

2. An electrical connector for propagation of electrical signals in a plurality of propagation paths between circuit connections and ground conductors of a pair of circuit components, each circuit presenting a certain characteristic impedance at an interconnect thereof, said connector comprising: support means having openings therethrough and electrically conductive signal-propagating interconnect means arranged in said openings of said support means for engagement with interconnects of said components adjacent said support means, ground conductor means included in said support means and having portions in adjacent relation to said signal-propagating interconnect means, ground connection means for connecting said ground conductor means to ground conductors of interconnected circuit components, and insulating means of dielectric material included in said support means for supporting said signal-propagating interconnect means within said openings and in electrically insulated relation to adjacent portions of said ground conductor means, the configuration and characteristics of said ground conductor means and said insulating means in relation to each of said signal-propagating interconnect means is such as to provide both air and solid dielectric material between said signal-propagating interconnect means and said ground conductors so proportioned as to obtain characteristic impedances for matching the characteristic impedances of circuits interconnected by said signal-propagating interconnect means.

3. An electrical connector for propagation of electrical signals in a plurality of propagation paths between circuit connections and ground conductors of a pair of circuit components, each circuit presenting a certain characteristic impedance at an interconnect thereof, said connector comprising: support means having openings therethrough and electrically conductive signal-propagating interconnect means arranged in said openings of said support means for engagement with interconnects of said components adjacent said support means, ground conductor means included in said support means and having portions in adjacent relation to said signal-propagating interconnect means, ground connection means for connecting said ground conductor means to ground conductors of interconnected circuit components, and insulating means of dielectric material included in said support means for supporting said signal-propagating interconnect means within said openings and in electrically insulated relation to adjacent portions of said ground conductor means, each of said signal-propagating interconnect means being of elongated form, and the configuration and characteristics of said ground conductor means and said insulating means in relation to each of said signal-propagating interconnect means being such as to obtain a certain characteristic impedance for matching the characteristic impedances of circuits interconnected by each signals-propagating interconnect means and to minimize variations in the characteristic impedance of the signal path along each of said signal-propagating interconnect means.

4. An electrical connector as defined in claim 3, wherein the configuration and characteristics of said ground conductor means and said insulating means in relation to said signal-propagating interconnect means is such as to define an air gap along at least a portion of the length of each signal-propagating interconnect means for control of characteristic impedance along the length thereof.

5. An electrical connector for propagation of electrical signals in a plurality of propagation paths between circuit connections and ground conductors for effecting connections between conductive pads of adjacent circuit boards, each circuit presenting a certain characteristic impedance at a conductive pad thereof, said connector comprising: support means having openings therethrough and electrically conductive signal-propagating interconnect means arranged in said openings of said support means for engagement with said conductive pads adjacent said support means, ground conductor means included in said support means and having portions in adjacent relation to said signal-propagating interconnect means, ground connection means for connecting said ground conductor means to ground conductors of interconnected circuit components, and insulating means of dielectric material included in said support means for supporting said signal-propagating interconnect means within said openings and in electrically insulated relation to adjacent portions of said ground conductor means, the configuration and characteristics of said ground conductor means and said insulating means in relation to each of said signal-propagating interconnect means being such as to obtain a certain characteristic impedance for matching the characteristic impedances of circuits interconnected by each signal-propagating interconnect means wherein each of said signal-propagating interconnect means is compressibly resilient for pressure engagement with said pads of said circuit boards.

6. The connector as in claim 5 wherein each said signal-propagating interconnect means includes a wadded conductor contact element.

7. The connector as in claim 6 wherein each of said signal-propagating interconnect means includes a solid conductor element.

8. The connector as in claim 7 wherein said solid conductor element is reciprocally movable relative to said insulating means by said wadded conductor contact element.

9. The connector as in claim 5 wherein each said signal-propagating interconnect means includes two solid conductor elements and a resilient conductor contact element disposed in generally coaxial alignment with one another in the respective opening in said support means, said resilient conductive contact element being between and in abutting relation with said solid conductor elements, and each of said abutting solid conductor elements being reciprocally movable relative to said insulating means by said resilient conductor contact element.

10. The connector as in claim 9 wherein each of said solid conductor elements includes an end remote from said wadded conductor contact element therebetween, each of said remote ends being exposed through the respective end of the respective one of said openings through said support means for such precise engagement with said pads of circuit boards.

* * * * *

UNITED STATES PATENT AND TRADEMARK OFFICE
CERTIFICATE OF CORRECTION

PATENT NO. : 5,672,062
DATED : September 30, 1997
INVENTOR(S) : Richard J. Lindeman It is certified that error appears in the above-identified patent and that said Letters Patent is hereby corrected as shown below:

ON THE TITLE PAGE:

[56] References Cited, U.S. PATENT DOCUMENTS:
Page 2, Column 2, line 7: "Connor"
should read --Conrad--.

IN THE SPECIFICATION:

In Column 5, line 5: "illustrating" should be deleted.
In Column 6, line 54: "the-plates." should read
--the plates.--.
In Column 7, lines 22 and 23: "54 and a corresponding
button 54A at the upper face of the connector at"
should read --54 at the upper face of the connector
and a corresponding button 54A at--.
Column 5, line 6 insert --illustrating -- after "but".

IN THE CLAIMS:
In Claim 3, Column 14, line 27: "signals-" should
read --signal--.

Signed and Sealed this

Twenty-fourth Day of November,1998

Attest:

BRUCE LEHMAN

Attesting Officer        Commissioner of Patents and Trademarks